(12) United States Patent
Tao et al.

(10) Patent No.: US 6,369,439 B1
(45) Date of Patent: Apr. 9, 2002

(54) STRIP OF SEMICONDUCTOR PACKAGE

(75) Inventors: Su Tao, Kaohsiung; Kuo-Pin Yang, Kaohsiung Hsien; Tai-Chun Huang, Kaohsiung, all of (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 09/366,637

(22) Filed: Aug. 4, 1999

(51) Int. Cl.$^7$ .............................................. H01L 23/465
(52) U.S. Cl. ........................................ 257/666; 257/669
(58) Field of Search ................................ 257/666, 676, 257/669

(56) References Cited

U.S. PATENT DOCUMENTS 6,021,563 A * 2/2000 Heo et al. ...................... 29/846

\* cited by examiner

*Primary Examiner*—Roy Potter
(74) *Attorney, Agent, or Firm*—Bacon & Thomas

(57) ABSTRACT

A strip mainly includes a plurality of guide holes, a plurality of position holes, a plurality of separation holes, a plurality of second slots and a plurality of substrate areas. Guide holes are arranged on two sides of the strip for carrying during processing, and position holes are arranged at four corners of the strip for positioning on the machine during processing. Separation holes and slots are to be contiguous to the substrate areas and separate the substrate areas from one another so that the discontinuous warpage of the substrate area affects the peripheral substrate areas. Therefore, it can reduce the chance of breaking chip in the substrate area. The two ends of the substrate are adjacent to the slots to reduce the stress of other substrates in the longitudinal direction actuating the chip during heat treatment in processing. The strip further includes a metal layer surrounding the substrate areas to increase the stiffness of the entirety of the strip.

11 Claims, 5 Drawing Sheets

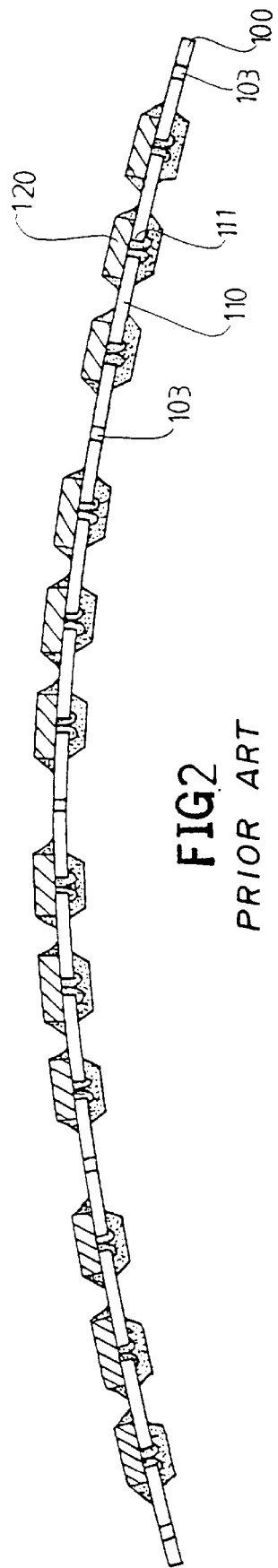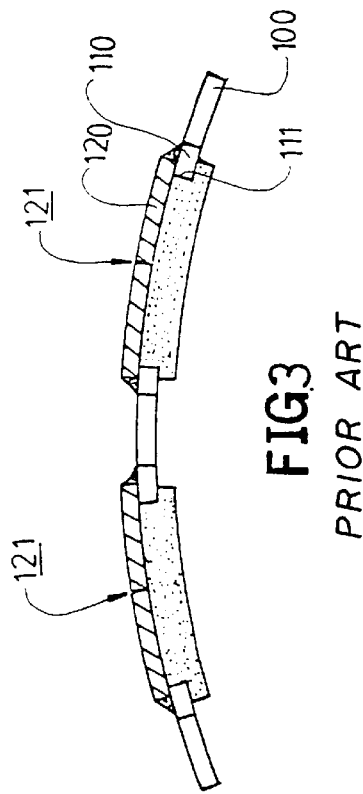
FIG. 2 PRIOR ART
FIG. 3 PRIOR ART

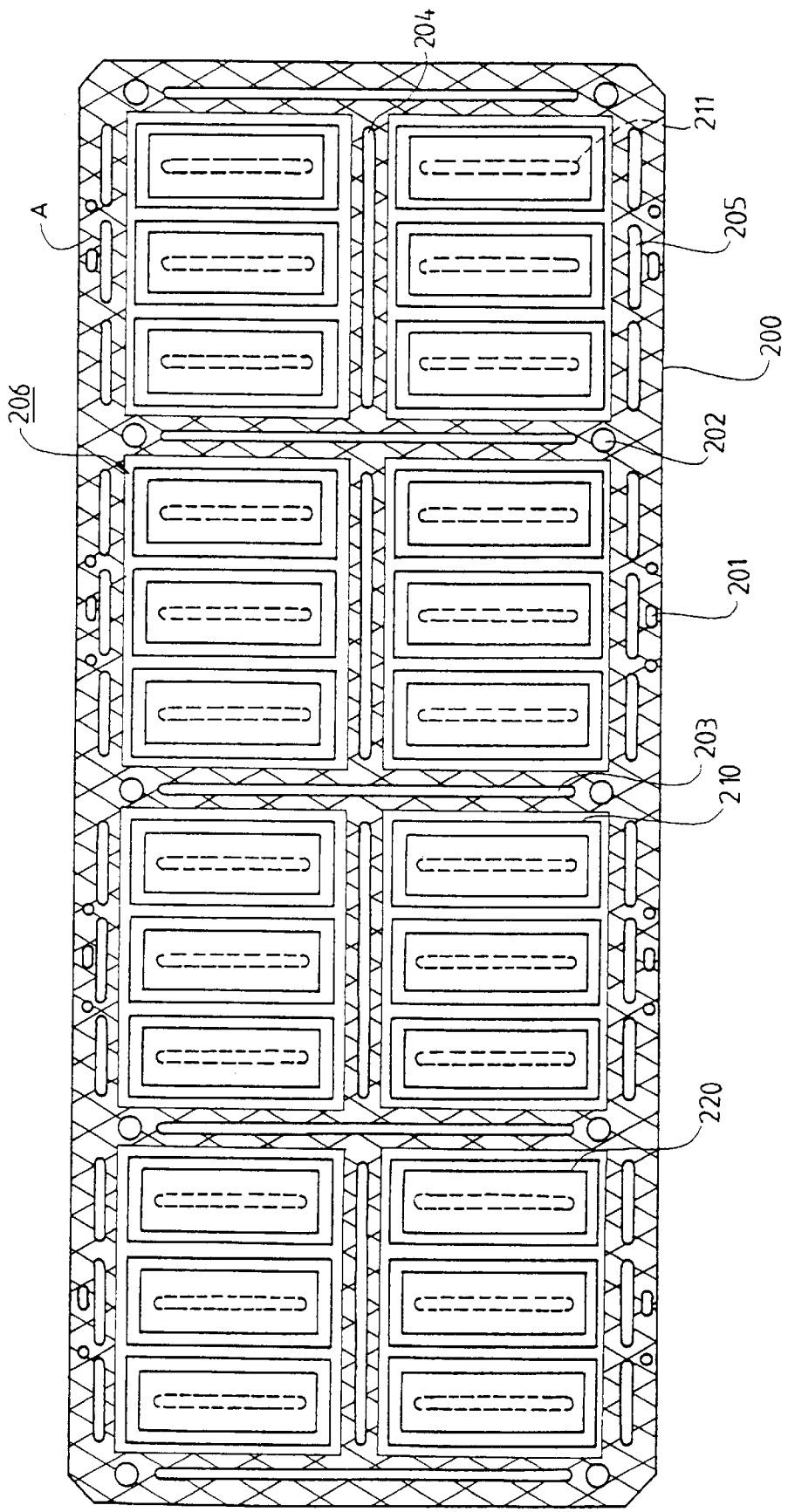

STRIP OF SEMICONDUCTOR PACKAGE

BACKGROUND OF THE INVENTION

1. Field of the Invention

The present invention relates generally to a strip of semiconductor package and more particularly to a strip having a plurality of separation holes and a plurality of slots, substrate areas thereof are surrounded by separation holes and slots.

2. Description of the Related Art

When the strip is in the packaging process under high temperatures, the different CTE (Coefficient of Thermal Expansion) of the strip and semiconductor devices attached thereon results in thermal mismatch that can result in the warpage of the strip. Warpage of the strip effects stress to the chip attached thereon; it damages or breaks the chips of the semiconductor devices.

Referring to FIG. 1, a conventional strip 100 includes a plurality of substrates 110 arranged adjacent to one another. Substrate 110 further has a hole 111 which is adhesively attached to a chip 120 by an adhesive layer. The strip 100 further includes a plurality of guide holes 101 for carrying, a plurality of position holes 102 for processing and a plurality of separation-elongated holes 103 in the transverse direction.

FIG. 2 shows the warpage in the longitudinal direction which causes the strip 100 to bend between the two distal ends. Because the separation-elongated holes 103 are arranged side-by-side along the longitudinal direction of the strip 100, it reduces the stress in the transverse direction of the chip 120 which results from the warpage of the strip 100. In addition, the width of the chip 120 offers enhanced resistance to the stress of the warpage; there is little chance of breaking the chip 120 in the longitudinal direction.

FIG. 3 shows the warpage in the transverse direction makes the strip 100 bend between the two distal sides. Because the separation-elongated holes 103 are not arranged in the transverse direction of the strip 100, there is no chance to reduce the stress in the transverse direction of the chip 120 and this results from the warpage of the strip 100. In addition, the length of the chip 120 offers a weak resistance to the stress of warpage; it has more chance to break the chip 120 in the transverse direction.

The present invention intends to provide a strip with a plurality of slots which is arranged adjacent to substrate areas in such a way as to mitigate and overcome the above problem. Moreover, the strip has a plurality of substrate areas and a metal layer which surround the substrate areas; the metal layer increases the stiffness of the entirety of the strip.

SUMMARY OF THE INVENTION

The primary objective of this invention is to provide a strip of semiconductor package which includes a plurality of slots arranged side-by-side in the transverse direction of the strip in order to reduce the stress affecting the substrate areas which results from the warpage of other substrate areas in the transverse direction of the strip.

The secondary objective of this invention is to provide a strip of semiconductor package which includes a metal layer surrounding the substrate areas to increase the stiffness of the entirety of the strip.

The present invention is a strip of semiconductor package in accordance with an embodiment; a strip substantially includes a plurality of guide holes, a plurality of position holes, a plurality of separation holes, a plurality of second slots and a plurality of substrate areas. Guide holes are arranged on two sides of the strip for carrying during processing, and position holes are arranged at four corners of the strip for positioning on the machine during processing. Separation holes and slots are to be contiguous to the substrate areas and separate the substrate areas from one another so that the discontinuous warpage of the substrate area affects the peripheral substrate areas. This reduces the chance of breaking the chip in the substrate area. The substrate area further comprises a plurality of substrates on which holes are provided. The hole is adhesively attached to a chip and provided for wire bonding of the chip. The two ends of the substrate are adjacent to the slots to reduce the stress of other substrates in the longitudinal direction actuating to the chip during heat treating in process. The strip further includes a metal layer surrounding the substrate areas to increase the stiffness of the entirety of the strip.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein;

FIG. 2 is a sectional view of FIG. 1, taken along line 2—2, of a conventional strip of semiconductor package;

FIG. 3 is a sectional view of FIG. 1, taken along line 3—3, of a conventional strip of semiconductor package;

FIG. 6 is a top view of a strip of semiconductor package in accordance with a third embodiment of the present invention.

DETAILED DESCRIPTION OF THE INVENTION

The strip of the present invention mainly comprises a plurality of slots adjacent to the two ends of the substrate to reduce the stress affecting the substrate areas that results from the warpage of other substrate areas of the strip. The slot is preferred to be an elongated hole or the like.

Figure 1:
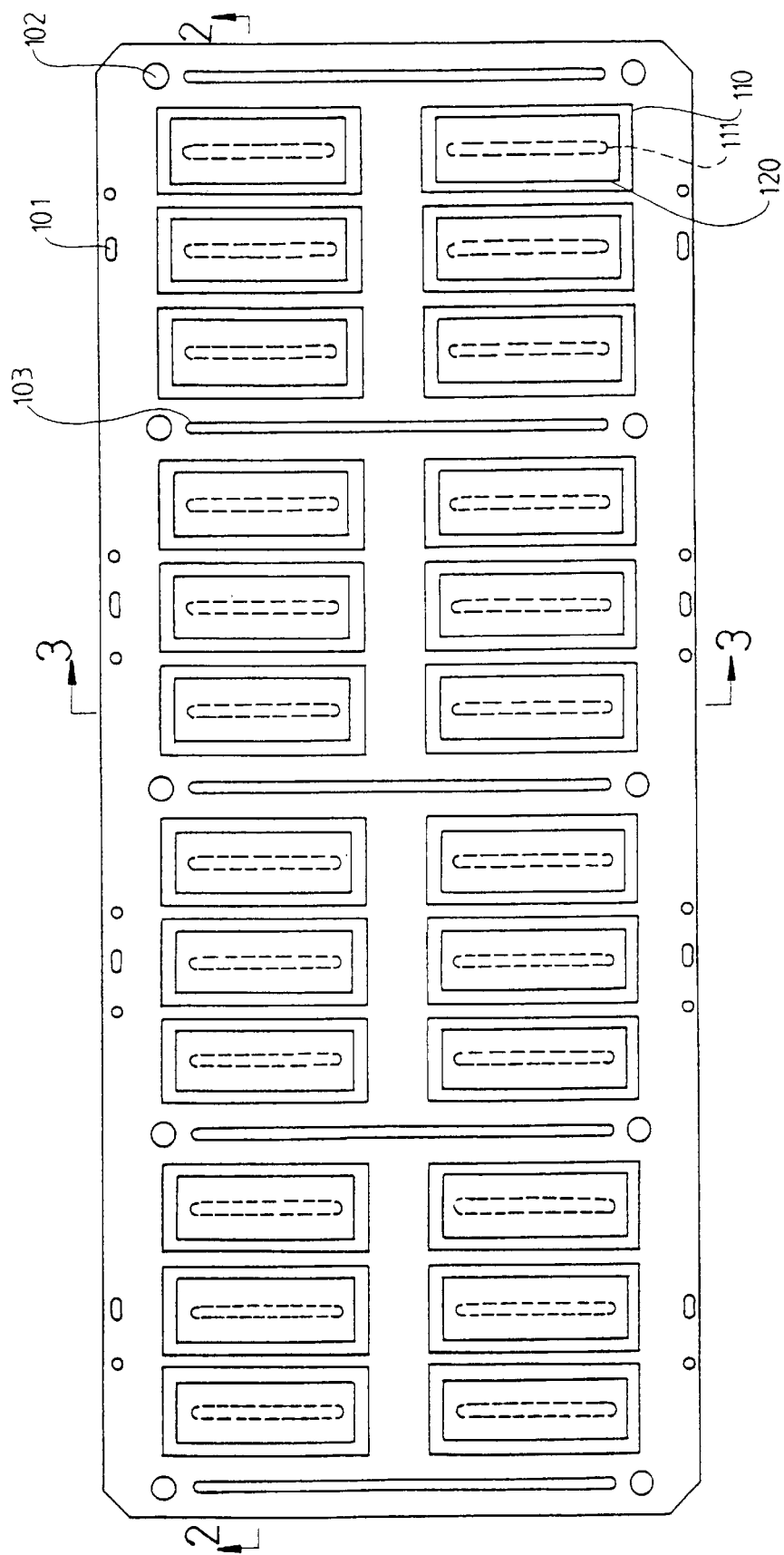
FIG. 1 is a top view of a conventional strip of semiconductor package.
Figure 4:
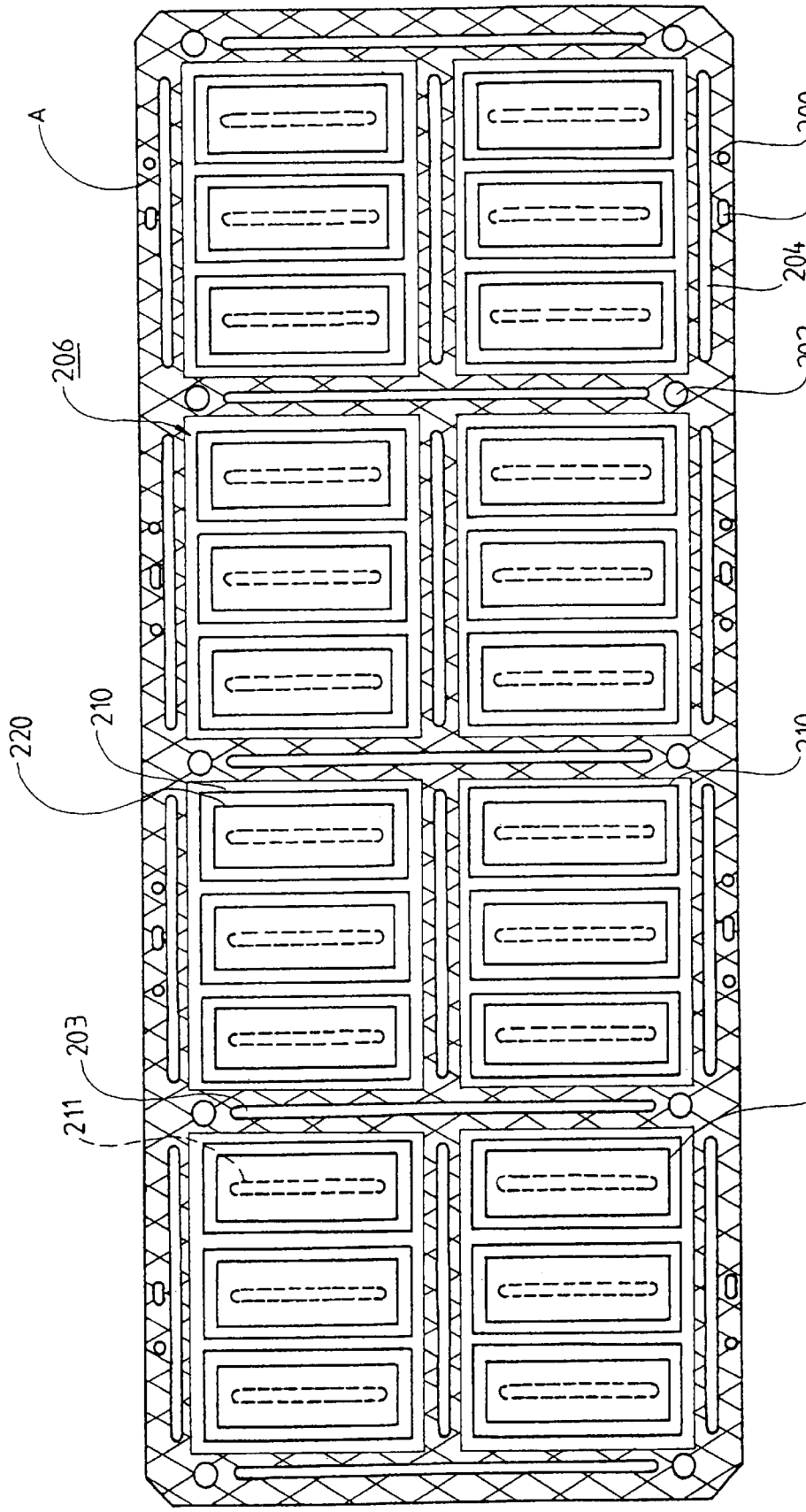
FIG. 4 is a top view of a strip of semiconductor package in accordance with a first embodiment of the present invention.

Referring to FIG. 4, a strip 200, in accordance with the first embodiment of the present invention, mainly comprises a plurality of guide holes 201, a plurality of position holes 202, a plurality of separation holes 203, a plurality of first slots 204 and a plurality of substrate areas 206. Guide holes 201 are arranged at two sides of the strip 200 for carrying during processing and position holes 203 are arranged at four corners of the strip 200 for positioning on the machine during processing. Separation holes 203 and the first slots 204 are to be contiguous to the substrate areas 206 and separate the substrate areas 206 from one another so that the discontinuous warpage of the substrate area 206 affects the peripheral substrate areas 206. Therefore, slots 204 can reduce the chance of breaking chip 220 in the substrate area 206. The substrate area 206 is arranged in order on the strip 200 and further comprises a plurality of substrates 210 arranged side-by-side and substrate 210 provides a hole 211 at its center. The hole 211 is adhesively attached to a chip 220 and provided for wire bonding of the chip 220. The two ends of the substrate area 206 are adjacent to the slots 204 to reduce the stress of other substrate areas in the transverse direction of the strip 200 actuating to the chip 220 during heat treating process.

Figure 5:
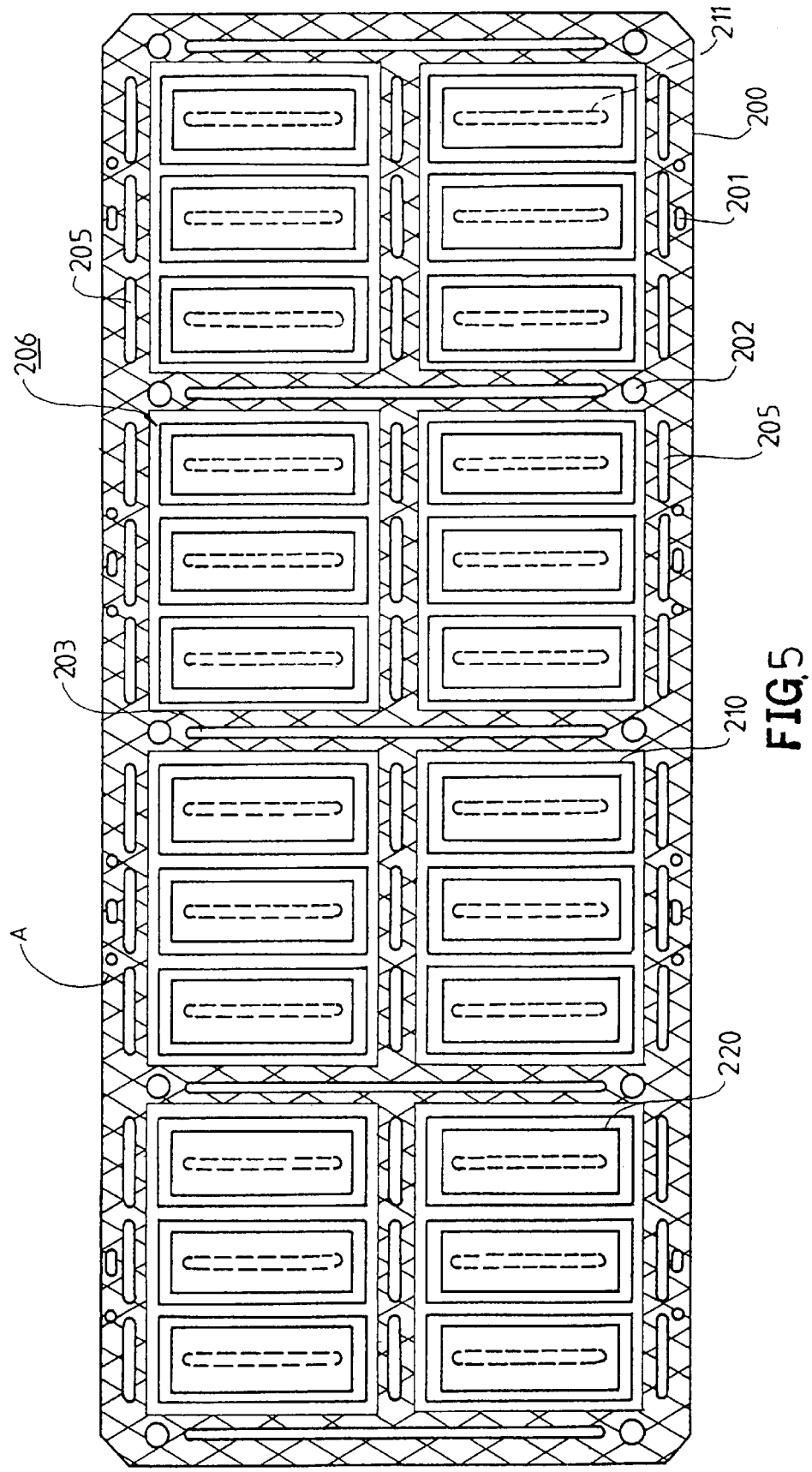
FIG. 5 is a top view of a strip of semiconductor package in accordance with a second embodiment of the present invention.

Referring to FIG. 5, a strip 200, in accordance with the second embodiment of the present invention, mainly comprises a plurality of guide holes 201, a plurality of position holes 202, a plurality of separation holes 203, a plurality of second slots 205 and a plurality of substrate areas 206. Guide holes 201 are arranged on two sides of the strip 200 for carrying during processing and position holes 203 are arranged at four corners of the strip 200 for positioning on the machine during processing. Separation holes 203 and a plurality of second slots 205 are to be contiguous to the substrate areas 206 and separate the substrate areas 206 from one another so that the discontinuous warpage of the substrate area 206 affects the peripheral substrate areas 206. Therefore, slots 205 can reduce the chance of breaking chip 220 in the substrate area 206. The substrate area 206 is arranged in order on the strip 200 and further comprises a plurality of substrates 210 arranged side-by-side one, and substrate 210 provides a hole 211 at its center. The hole 211 is adhesively attached to a chip 220 and provided for wire bonding of the chip 220. The two ends of the substrate area 206 are adjacent to the slots 205 to reduce the stress of other substrate areas in the transverse direction of the strip 200 actuating to the chip 220 during heat treating process.

Referring to FIG. 6, a strip 200, in accordance with the third embodiment of the present invention, mainly comprises a plurality of guide holes 201, a plurality of position holes 202, a plurality of separation holes 203, a plurality of first slots 204, a plurality of second slots 205 and a plurality of substrate areas 206. Guide holes 201 are arranged on two sides of the strip 200 for carrying during processing. Position holes 203 are arranged at four corners of the strip 200 for positioning on the machine during processing. The length of first slots 204 is substantially longer than second slots 205. Separation holes 203, the first slots 204 and a plurality of second slots 205 are to be contiguous to the substrate areas 206 and separate the substrate areas 206 from one another so that the discontinuous warpage of the substrate area 206 affects the peripheral substrate areas 206. Therefore, slots 204 and 205 can reduce the chance of breaking chip 220 in the substrate area 206. The substrate area 206 is arranged in order on the strip 200 to further comprise a plurality of substrates 210 arranged side-by-side, and substrate 210 provides a hole 211 at its center. The hole 211 is adhesively attached to a chip 220 and provides for wire bonding of the chip 220. One end of the substrate area 206 is adjacent to first slot 204 and the other end is adjacent to second slot 205 to reduce the stress of other substrate areas in the transverse direction of the strip 200 actuating to the chip 220 during heat treating process.

Referring to FIGS. 4, 5 and 6, the strip, in accordance with the present invention, further includes a metal layer (copper) surrounding the substrate areas 206. The metal layer supporting the construction of strip 200 is left on the region A (shadow area) of the strip 200 when the strip 200 is etched to form the electrical circuit. The metal layer increases the stiffness of the entirety of the strip. The strip 200 essentially consists of a plurality of metal layers, a plurality of BT (Bismaleimide Triagzine) layers and two solder masks, and the metal layers and BT layers are interposed between two solder masks to form the outer surface of the strip 200.

Comparing FIG. 1 to FIGS. 4, 5 and 6, the conventional strip 100 is compared to the strip 200 of the present invention. The first slots 204 and the second slots 205 of the present invention are arranged at two ends of the substrate areas 206, in order to reduce the stress effecting to the substrate areas 206 resulting from the warpage of other substrate areas 206 in the transverse direction of the strip 200. Moreover, a metal layer of the present invention surrounds the substrate areas 206 to increase the stiffness of the entirety of the strip 200. The conventional strip 100, however, does not arrange slots at two ends of the substrate areas, so that longitudinal of the chip 120 relatively offers a weak resistance to the stress of warpage; it stands a greater chance of breaking the chip 120 in its transverse direction.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A strip comprising:

a plurality of separation holes provided on the strip;

a plurality of slots provided on the strip;

a plurality of substrate areas which are surrounded by the separation holes and slots; and a plurality of substrate areas which are arranged in the substrate areas and two ends of the substrates are adjacent to the slots;

wherein the slots reduce the stress affecting the substrate areas which results from warpage of other substrate areas, and wherein the strip further comprises a metal layer which surrounds the substrate areas and increases the stiffness of the entirety of the strip.

2. The strip as defined in claim 1, which further comprises a plurality of guide holes and a plurality of position holes.

3. The strip as defined in claim 1, wherein the substrate further comprises a hole which is provided for wire bonding of a chip.

4. The strip as defined in claim 1, wherein the slots are formed as elongated holes.

5. The strip as defined in claim 1, wherein the metal layer is left on the strip when the strip is etched to form an electrical circuit.

6. A strip which comprises:

a plurality of separation holes provided on the strip;

a plurality of slots provided on the strip;

a plurality of substrate areas which is surrounded by the separation holes and slots;

a plurality of substrates which is arranged in the substrate areas and two ends of the substrates are adjacent to the slots; and a metal layer, which surrounds the substrate areas wherein the slots reduce the stress affecting the substrate areas which results from the warpage of other substrate areas.

7. The strip as defined in claim 6, which further comprises a plurality of guide holes and a plurality of position holes.

8. The strip as defined in claim 6, wherein the substrate further comprises a hole which is provided for wire bonding of a chip.

9. The strip as defined in claim 6, wherein the slots are formed as elongated holes.

10. The strip as defined in claim 6, wherein the strip further comprises a metal layer which surrounds the substrate areas and increases the stiffness of the entirety of the strip.

11. The strip as defined in claim 10, wherein the metal layer is left on the strip when the strip is etched to form the electrical circuit.

* * * * *